United States Patent [19]

Henningsson et al.

[11] Patent Number: 5,520,554
[45] Date of Patent: May 28, 1996

[54] CABLE CONNECTION AND SHIELDING DEVICE

[75] Inventors: Bo U. E. Henningsson; Lars Lindqvist, both of Nynäshamns, Sweden

[73] Assignee: Telefonaktiebolaget LM Ericsson, Stockholm, Sweden

[21] Appl. No.: 417,030

[22] Filed: Apr. 5, 1995

[30] Foreign Application Priority Data

Apr. 7, 1994 [SE] Sweden .................................. 9401165

[51] Int. Cl.$^6$ ................................................. H01R 13/648
[52] U.S. Cl. ........................................... 439/607; 439/108
[58] Field of Search ..................... 439/607, 608, 439/609, 101, 108, 540

[56] References Cited

U.S. PATENT DOCUMENTS

| | | | |
|---|---|---|---|
| 4,331,989 | 7/1982 | Asick et al. | 439/609 |
| 4,464,540 | 8/1984 | Reeder . | |
| 5,067,914 | 11/1991 | Seidel et al. | 439/609 |
| 5,391,836 | 2/1995 | Bortas et al. . | |

OTHER PUBLICATIONS

IBM Technical Disclosure Bulletin, vol. 35, No. 7, Dec. 1992, "Fulcrum–Type, Dual–Opposed, Triple–Line–Contact, EMC/EMI Shield for I/O Connectors", pp. 352–355, See Fig. B.

IBM Technical Disclosure Bulletin, vol. 30, No. 6, Nov. 1987, "Connector Shield/Bracket to Provide Electromagnetic Compatibility", pp. 18–19, See Fig. 1.

Primary Examiner—Khiem Nguyen
Attorney, Agent, or Firm—Burns, Doane, Swecker & Mathis

[57] ABSTRACT

A device for electromagnetically shielding a cable or the like that is connected to a board connector on a circuit board inserted into a magazine using a corresponding cable connector. The circuit board includes a board front having an opening through which the cable connector is connected to the board connector. The device includes a shielding sleeve that is mounted on the circuit board over the board connector and extends through the opening in the board front. A shielding spring is mounted on the shielding sleeve between the sleeve and the opening in the board front. The sleeve is open towards the circuit board and the board front opening and is provided with recesses. The shielding spring includes a frame that extends around the sleeve and includes a plurality of outwardly directed, resilient tongues that lie against the board front. A plurality of resilient tabs lie along the shielding sleeve, the outermost parts of which include inwardly directed tongues. The inwardly directed tongues are received in the recesses in the sleeve and lie against the cable connector inserted in the shielding sleeve.

5 Claims, 2 Drawing Sheets

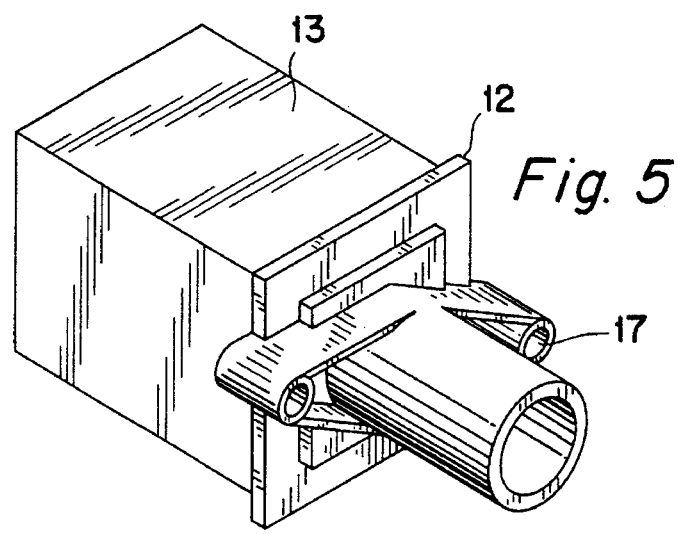
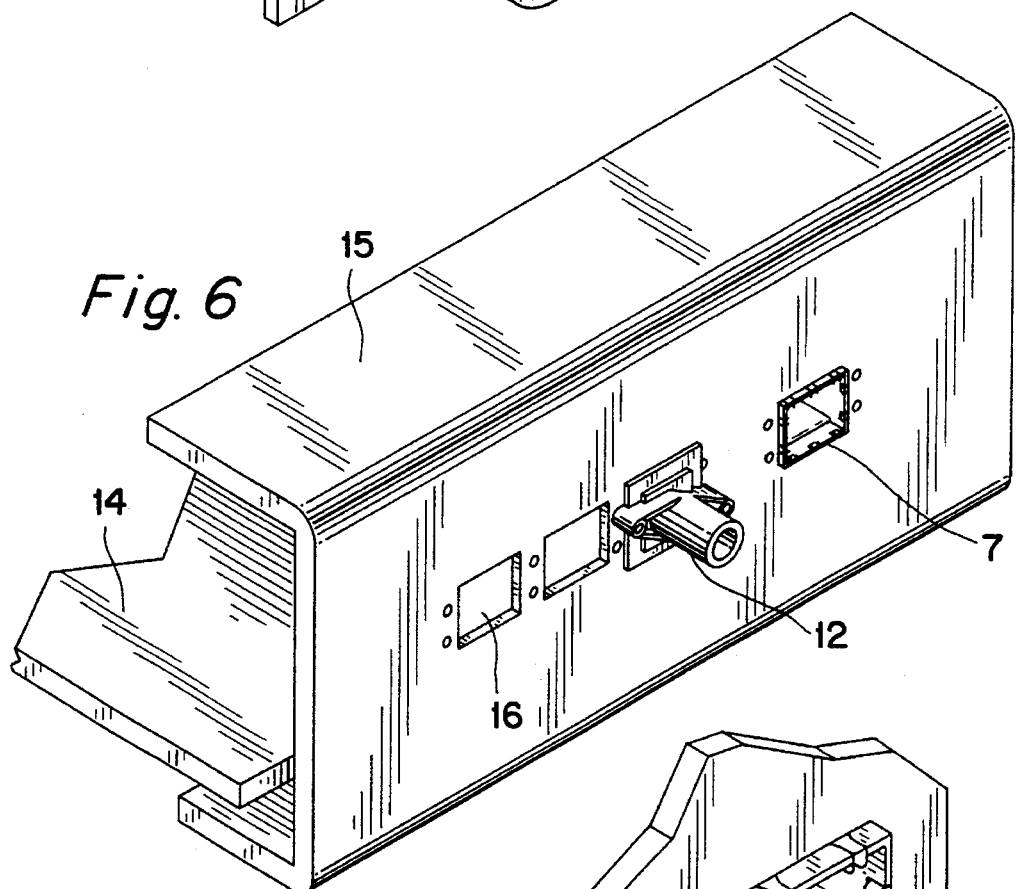
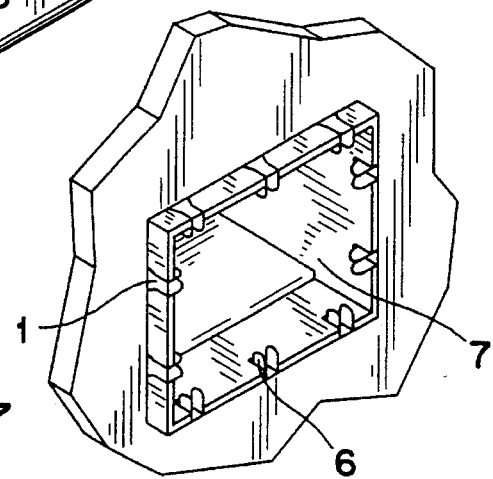

CABLE CONNECTION AND SHIELDING DEVICE

BACKGROUND

The present invention relates to a device for EMC-shielding an incoming or an outgoing cable or the like which is connected by means of a cable connector to a printed circuit board inserted in a magazine by means of a corresponding board connector on said board, wherein the printed circuit board includes a board front having an opening through which the cable connecting device is connected to the board connecting device.

The electronic components of telecommunications systems often need to be shielded against electromagnetic radiation, particularly in view of the fact that present day requirements are based on much the higher frequencies, up to 5 GHz, that are to be attenuated, or dampened, from the surroundings, so as not to be influenced by external disturbances and so as not themselves to disturb other parts of the equipment to which they are fitted, as a result of radiation from the components concerned. The need to shield reliably incoming or outgoing cables and the like is particularly great. In this regard, it is important that associated elements are properly earthed in relation to one another. Several different solutions have been proposed to this end. However, none of the devices proposed have solved the shielding and earthing problem satisfactorily, in a simple, inexpensive and worksaving manner.

SUMMARY

The object of the present invention is to eliminate the above drawbacks of earlier proposed solutions, and to provide a device which will solve the problem of reliably shielding cable connections to circuit board components in a simple and inexpensive manner. This object has been achieved with a device having the characteristic features set forth in the accompanying claims.

A device constructed in accordance with the invention has the advantage of being particularly simple in design and of effectively shielding and earthing incoming and outgoing cables or the like connected to a circuit board. The device can also be manufactured cheaply and can be fitted easily.

The invention will now be described in more detail with reference to a preferred embodiment thereof and also with reference to the accompanying drawings.

BRIEF DESCRIPTION OF THE DRAWINGS

FIG. 5 is a perspective view of a cable connecting device.

FIG. 6 is a perspective view of a circuit board and associated board front, and a cable connecting device connected to the board, and also shows a shielding sleeve with shielding spring prior to connecting the cable connecting device.

FIG. 7 is a view in larger scale of the shielding sleeve projecting through the board front.

DETAILED DESCRIPTION

Figure 1:
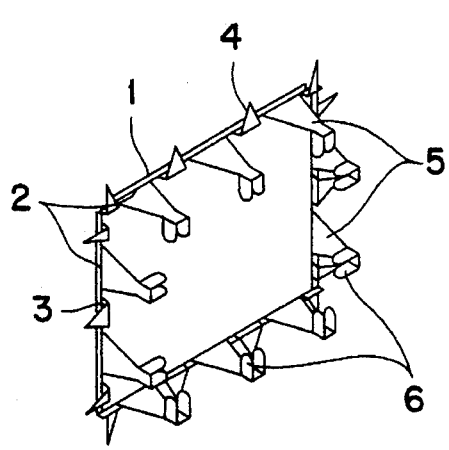
FIG. 1 is a perspective view of a shielding spring forming part of an inventive device.
Figure 2:
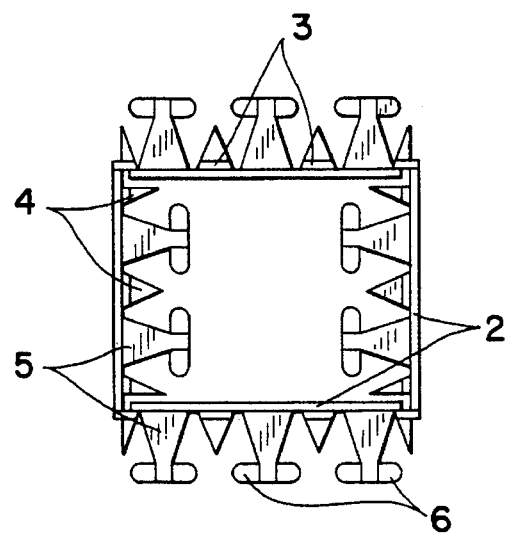
FIG. 2 is a view from above of a blank from which the shielding spring can be produced.

FIG. 1 is a perspective view of a shielding spring 1 which forms part of an inventive shielding device. The spring 1 is made of thin metal sheet and is punched from the sheet to provide a blank having the configuration shown in FIG. 2. This blank is then bent so as to obtain the construction shown in FIG. 1. The spring has a flat rectangular frame 2, from which there project at right angles a plurality of tongues 3 whose outermost parts 4 are bent outwards. A plurality of tabs 5 extend at right angles from the frame 2, the outermost parts of the tabs being provided with inwardly bent tongues 6.

Figure 3:
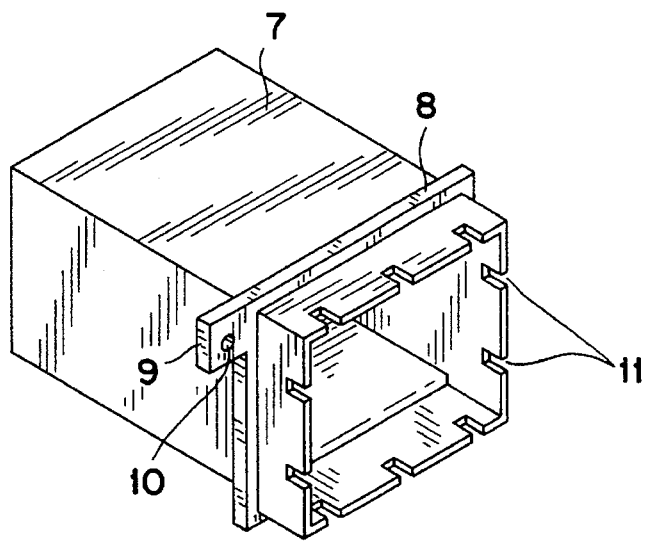
FIG. 3 is a perspective view of a shielding sleeve which forms part of the inventive device.

The inventive device also includes a shielding sleeve or casing 7, which is shown in FIG. 3. The shielding sleeve 7 is comprised of a parallelepipedic metal casing which is intended to be fitted to a circuit board over a board connector provided thereon. A flange 8 projects at right angles from the casing and extends around the perimeter thereof. The flange 8 is extended at two diametrically opposed sides to provide projections 9 (only one of which is shown in the Figure) which include respective threaded holes 10 for the attachment of a cable connector, as a explained in more detail below. The casing is open towards the circuit board and also towards one side so that the cable connector can be inserted into the sleeve or casing and be brought into electrical contact with the board connecting device. Extending around the sleeve 7 at said open side are a plurality of recesses or notches 11 which correspond to the tongues 6 on the tabs 5 of the screening spring 1.

Figure 4:
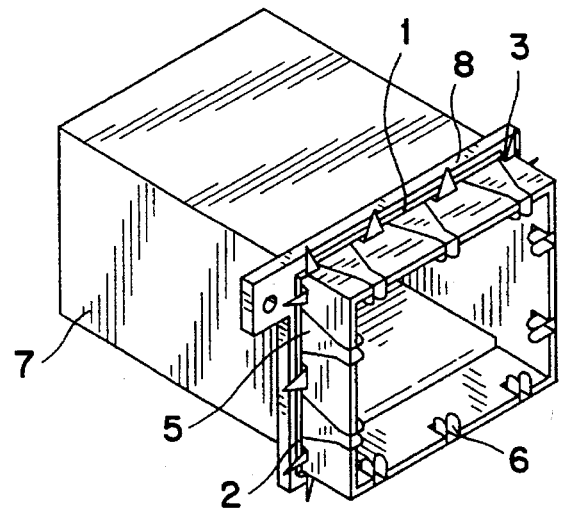
FIG. 4 is a perspective view of the shielding sleeve with a shielding spring fitted thereto.

The spring 1 is fitted to the sleeve 7 with the frame 2 abutting the flange 8 and the tongues 3 and the tabs 5 abutting the outer surfaces of the sleeve, as illustrated in FIG. 4. Parts 4 on the tongues 3 project outwards from the sleeve and the tongues 6 on the tabs 5 project in through the recesses 11. When a cable connector, such as the cable connector 12 shown by way of example in FIG. 5, is inserted into the sleeve, the insertion part 13 of the connector will engage with the tongues 6 and therewith press the tongues outwards. As a result of the resiliency of the tabs 5, the tongues are pressed against the cable connector 12 and therewith ensure a good earth connection between the sleeve 7 and the cable connector 12, via the spring 1. The earth connection can be further improved by providing the spring 1 with wart-like projections (not shown) on the frame, on that side which faces towards the flange 8.

It will be understood that the illustrated embodiment of the tongues 6 has been given solely by way of example, and that the tongues may be given other designs. The sole condition is that the tongues are rounded or bevelled in some way, so that no forces will be transmitted from the cable connector 12 to the tongues 6 in the insertion direction as the connector is inserted into the sleeve or casing.

FIG. 6 illustrates an example of a circuit board 14 with an associated board front 15, with which the inventive device shall be used. The board front 15 includes a plurality of openings 16 with correspond to those board locations at which a board connector is provided on the circuit board. A connected cable connector 12 is shown in one of the openings on the board front, while a shielding sleeve 7 to which a shielding spring 1 is fitted in another opening, said spring 1 projecting partially through the opening 16 as shown in FIG. 7. The tongues 3 on the spring 1, and more specifically the parts 4 of said tongues, therewith lie resiliently against the side of the board front 15 proximal to the circuit board 15, this side not being visible in the Figures, and ensure an effective earth connection between the shielding sleeve 7 and the board front.

The cable connector 12 is fastened to the board front 15 with the aid of screws or corresponding fasteners, which are inserted through the fastener holes 17 provided on the connector, and through corresponding holes in the board front and are screwed into the threaded holes 10 on the sleeve 7. In practice a front plate having openings corresponding to the openings 16 and a thickness which corresponds at least to the outwardly projecting part of the sleeve 7 and the shielding spring 1, is fitted outside the board front. This front plate has not been shown in FIG. 6, however, for the sake of clarity.

It will be understood that the invention is not restricted to the aforedescribed and illustrated embodiments thereof, and that modifications and changes can be made within the scope of the following claims.

What is claimed is:

1. A device for electromagnetically shielding a cable connected by a cable connector to a corresponding board connector on a printed circuit board inserted in a magazine, wherein the circuit board includes a board front having an opening through which the cable connector is connected to the board connector, the device comprising:

a shielding sleeve that is fitted to the circuit board over the board connector and extends through the opening in the board front, wherein the shielding sleeve is open towards the circuit board and board front opening and is provided with recesses;

a shielding spring that is fitted to the shielding sleeve between the shielding sleeve and the opening in the board front, wherein the shielding spring includes a frame that extends around the shielding sleeve and has a plurality of outwardly directed resilient tongues that abut the board front; and a plurality of resilient tabs lying along the shielding sleeve, wherein the outermost parts of the tabs include respective inwardly directed tongues disposed in the recesses in the shielding sleeve and lying against the cable connector inserted in the shielding sleeve.

2. The device of claim 1, wherein the inwardly directed tongues are rounded or bevelled to facilitate insertion of the cable connector into the shielding sleeve.

3. The device of claim 1, wherein the shielding sleeve includes a flange that extends around the perimeter of the shielding sleeve and abuts the frame of the spring.

4. The device of claim 3, wherein the shielding spring is provided with wart-like projections that lie against the flange on the shielding sleeve.

5. The device of claim 3, wherein the flange is provided with screw-threaded holes for attachment of the cable connector to the board front.

* * * * *